(12) United States Patent
Lin et al.

(10) Patent No.: US 11,146,039 B2
(45) Date of Patent: Oct. 12, 2021

(54) TEMPERATURE CONTROLLED MULTI-CHANNEL TRANSMITTER OPTICAL SUBASSEMBLY AND TRANSCEIVER MODULE INCLUDING SAME

(71) Applicant: Applied Optoelectronics, Inc., Sugar Land, TX (US)

(72) Inventors: Kai-Sheng Lin, Sugar Land, TX (US); Hsiu-Che Wang, Rosenberg, TX (US); Ziliang Cai, Richmond, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/419,379

(22) Filed: May 22, 2019

(65) Prior Publication Data
US 2020/0373737 A1    Nov. 26, 2020

(51) Int. Cl.
*H04B 10/00* (2013.01)
*H01S 5/068* (2006.01)
(Continued)

(52) U.S. Cl.
CPC ...... *H01S 5/06804* (2013.01); *H01S 5/02453* (2013.01); *H01S 5/06837* (2013.01);
(Continued)

(58) Field of Classification Search
CPC ............ H01S 5/06837; H01S 5/02453; H01S 5/4087; H04B 10/506; H04B 10/40
See application file for complete search history.

(56) References Cited

U.S. PATENT DOCUMENTS 5,966,487 A * 10/1999 Gilliland .............. G02B 6/3869
                                                       385/139
6,275,317 B1 * 8/2001 Doerr .................. H04B 10/505
                                                       398/201
(Continued)

OTHER PUBLICATIONS

Fiberlabs, "Wavelength Division Multiplexing (WDM)", Mar. 26, 2019, www.fiberlabs.com/glossary/about-wdm/ , Section: WDM technology for datacom.*
(Continued)

*Primary Examiner* — Pranesh K Barua
(74) *Attorney, Agent, or Firm* — Grossman Tucker Perreault & Pfleger, PLLC; Normans S. Kinsella

(57) ABSTRACT

A temperature controlled multi-channel transmitter optical subassembly (TOSA), consistent with embodiments described herein, may be used in a multi-channel optical transceiver. The temperature controlled multi-channel TOSA generally includes an array of lasers to emit a plurality of different channel wavelengths. The lasers may be thermally tuned to the channel wavelengths by establishing a global temperature for the array of lasers such that the amount of heat communicated to each laser is substantially the same. The global temperature may be established, at least in part, by monitoring the shortest channel wavelength and/or a temperature of the lasers. The temperature of the lasers may then get increased via a shared heating device in thermal communication with the lasers until the shortest monitored wavelength substantially reaches the nominal shortest wavelength or the measured temperature substantially equals the global temperature.

14 Claims, 14 Drawing Sheets

(51) Int. Cl.
  *H01S 5/0683*  (2006.01)
  *H04B 10/40*   (2013.01)
  *H01S 5/024*   (2006.01)
  *H01S 5/40*    (2006.01)
  *H04B 10/50*   (2013.01)
  *H01S 5/00*    (2006.01)

(52) U.S. Cl.
  CPC ........... *H01S 5/4087* (2013.01); *H04B 10/40* (2013.01); *H04B 10/506* (2013.01); *H01S 5/005* (2013.01)

(56) References Cited

U.S. PATENT DOCUMENTS

| | | | | |
|---|---|---|---|---|
| 6,449,295 | B1* | 9/2002 | Ostromek | H01S 5/02453 257/601 |
| 2003/0087505 | A1* | 5/2003 | Deane | G02B 6/4292 438/422 |
| 2004/0057678 | A1* | 3/2004 | Morris | G02B 6/4249 385/92 |
| 2005/0013331 | A1* | 1/2005 | Kish, Jr. | H01S 5/0265 372/32 |
| 2007/0264872 | A1* | 11/2007 | Kuroda | H05K 1/0243 439/581 |
| 2008/0095536 | A1* | 4/2008 | Shen | G02B 6/1203 398/79 |
| 2009/0080904 | A1* | 3/2009 | Nakamoto | H04B 10/572 398/183 |
| 2011/0229129 | A1* | 9/2011 | Hu | H04B 10/40 398/34 |
| 2013/0049564 | A1* | 2/2013 | Jung | C09K 11/67 313/45 |
| 2013/0208745 | A1* | 8/2013 | Sjolund | H01S 5/02438 372/34 |
| 2014/0126917 | A1* | 5/2014 | Sato | G02B 6/4257 398/182 |
| 2015/0055960 | A1* | 2/2015 | Zheng | H04B 10/40 398/135 |
| 2015/0256259 | A1* | 9/2015 | Huang | G01J 1/0271 398/88 |
| 2015/0256261 | A1* | 9/2015 | Ho | H04J 14/0246 398/139 |
| 2016/0377822 | A1* | 12/2016 | Zheng | H01S 5/02453 385/14 |
| 2017/0059796 | A1* | 3/2017 | Huang | G02B 6/43 |
| 2017/0075079 | A1* | 3/2017 | Lin | G02B 6/4228 |
| 2017/0272169 | A1* | 9/2017 | Ho | G02B 6/4257 |
| 2017/0331250 | A1* | 11/2017 | Kagaya | H05K 1/181 |
| 2017/0357064 | A1* | 12/2017 | Nagarajan | H04B 10/40 |
| 2017/0359126 | A1* | 12/2017 | Ho | G11C 11/4096 |
| 2018/0011267 | A1* | 1/2018 | Lau | C07C 381/00 |
| 2018/0017745 | A1* | 1/2018 | Lin | B23K 26/032 |
| 2018/0052291 | A1* | 2/2018 | Lin | A47J 31/52 |
| 2018/0375286 | A1* | 12/2018 | Sato | H01S 5/02453 |
| 2020/0161813 | A1* | 5/2020 | Hirakawa | H01R 12/722 |

OTHER PUBLICATIONS

Fiberlabs, "Wavelength Division Multiplexing (WDM)", Mar. 26, 2019, www.fiberlabs.com/glossary/about-wdm/ , Section: WDM technology for datacom (Year: 2019) (Year: 2019).*

Fiberlabs, "Wavelength Division Multiplexing (WDM)", Mar. 26, 2019, www.fiberlabs.com/glossary/about-wdm/ , Section: WDM technology for datacom (Year: 2019).*

* cited by examiner

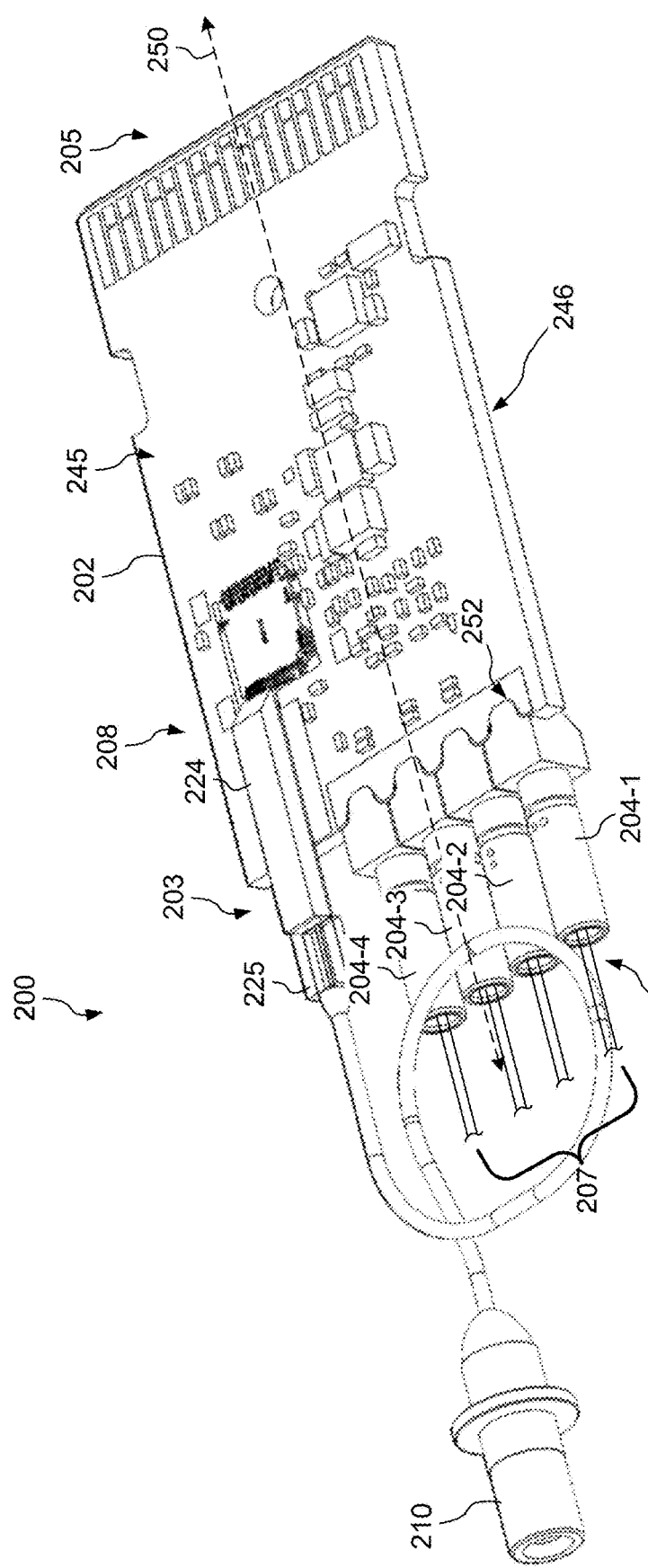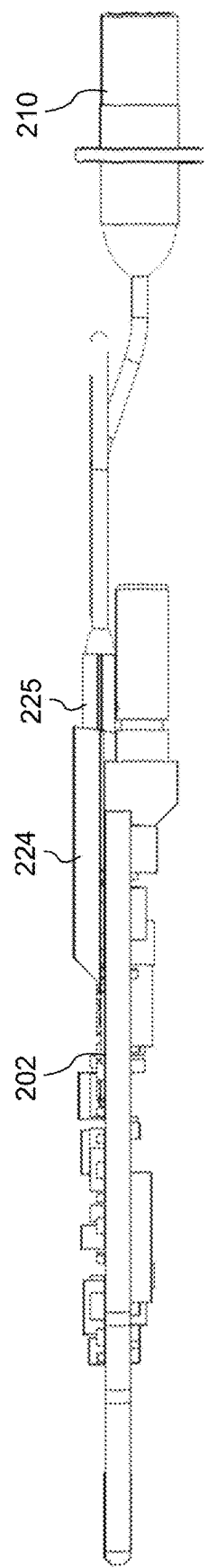
FIG. 2
FIG. 3

TEMPERATURE CONTROLLED MULTI-CHANNEL TRANSMITTER OPTICAL SUBASSEMBLY AND TRANSCEIVER MODULE INCLUDING SAME

TECHNICAL FIELD

The present disclosure relates to optical communication devices, and more particularly, to a temperature controlled multi-channel transmitter optical subassembly (TOSA).

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers, i.e., to convert electrical signals to channel wavelengths. On the other hand, ROSAs include a demultiplexer and one or more lenses for receiving an optical signal having multiple channel wavelengths to convert the same into proportional electrical signals. Existing configurations of optical transceivers include use of TOSAs and ROSAs with separate housings to support transmitting and receiving operations, respectively. In addition, the separate TOSA and ROSA housings may be coupled to receive and transmit circuitry via, for instance, flexible printed circuit boards and printed circuit assemblies (PCBAs).

BRIEF DESCRIPTION OF THE DRAWINGS

These and other features and advantages will be better understood by reading the following detailed description, taken together with the drawings wherein:

FIG. 2 is a perspective view of a multi-channel optical transceiver module for use in the multi-channel optical transceiver of FIG. 1, in accordance with an embodiment of the present disclosure.

FIG. 3 is a side view of the multi-channel optical transceiver module of FIG. 2, in accordance with an embodiment of the present disclosure.

DETAILED DESCRIPTION

Figure 1:
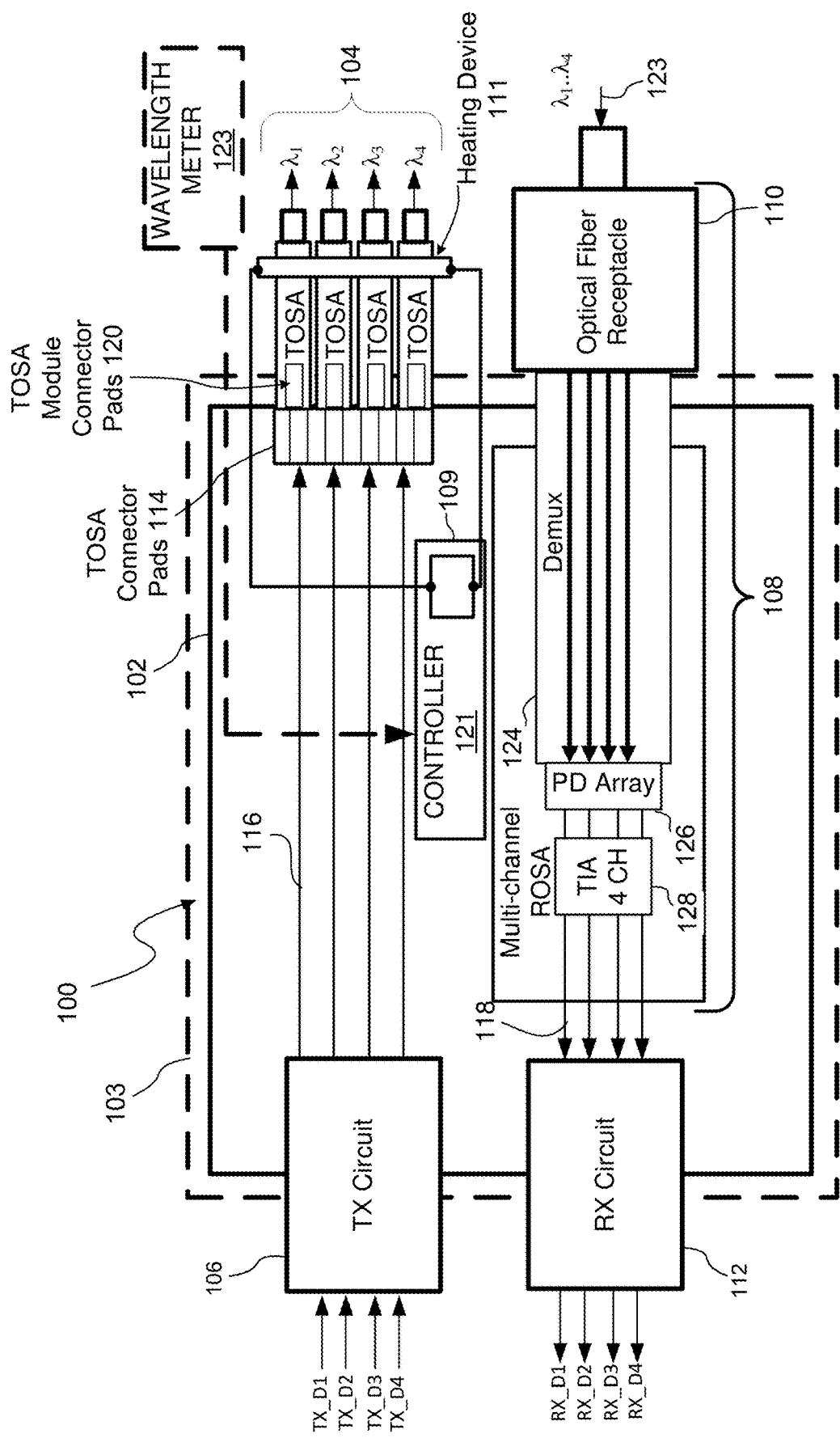
FIG. 1 is a block diagram of a multi-channel optical transceiver, consistent with embodiments of the present disclosure.

The present disclosure is generally directed to an optical transceiver module that includes a mounting section for aligning and coupling to associated TOSA modules, which may be referred to herein as simply laser assemblies. In particular, an embodiment of the present disclosure includes TOSA and ROSA components disposed on a printed circuit board assembly (PCBA). The PCBA includes a plurality of grooves at an optical coupling end to provide a TOSA mounting section. Each of the grooves provides at least one mating surface to receive and couple to an associated TOSA module. Opposite the optical coupling end, the PCBA includes an electric coupling section for coupling to, for example, a transmit (TX) circuit that provides one or more electrical signals to drive TOSA arrangements coupled to the TOSA mounting section.

In an embodiment, each TOSA module (or laser assembly) includes a base with a male coupling section having a generally arcuate shape that corresponds with the grooves at the optical coupling end of the PCBA. Alternatively, each TOSA module may include male coupling section having a substantially "I" beam shape defined by a web (or vertical section), and top and bottom flanges. The web may be tapered or otherwise dimensioned to be received by and couple to an associated groove of the PCBA with the top and bottom flanges acting as stops to prevent travel of the TOSA module once inserted into an associated groove. In either case, the male coupling section includes a plurality of mating surfaces for coupling to and being supported by the grooves of the PCBA. The embodiments for a TOSA module disclosed herein, in a general sense, provide a tongue-and-groove arrangement that permits each TOSA module to easily self-align into an associated groove/slot for purposes of coupling the same to electrical terminals of the PCBA during assembly.

Each TOSA module base further includes a laser arrangement that includes, for example, a laser diode driver (LDD), laser diode (LD), monitor photodiode, filtering capacitor(s), and focusing lens. The components of the laser arrangement may be disposed coaxially, or substantially coaxially and be aligned with a longitudinal center line of an optical coupling receptacle disposed at one end of the TOSA module base. Each TOSA module may support a single laser arrangement, or a dual-laser arrangement, whereby each TOSA module base includes two separate laser arrangements, each laser arrangement having a separate LDD, LD, monitor photodiode, focus lens and optical coupling receptacle.

Accordingly, an optical transceiver module consistent with the present disclosure has numerous advantages over other approaches that edge-mount laser assemblies to circuit boards by simply abutting one end of each laser assembly to an edge of the circuit board. This approach requires properly aligning each TOSA module along the X, Y and Z axis to ensure the TOSA module is in a correct location before securing via wire bonding or other fixation method. An incorrect placement, even by a few microns, can require re-alignment and reattachment, which can ultimately reduce yield. In addition, existing approaches generally include up to four TOSA modules, e.g., 4-channels, for each optical transceiver module. An embodiment of the present disclosure includes a dual-laser arrangement whereby each groove of a PCBA can couple to a single TOSA module base that provides two separate laser arrangements capable of emitting different or similar channel wavelengths. The dual laser arrangement may therefore increase channel density for a transceiver module, e.g., by a factor of 2, as each PCBA can couple to and support greater than four (4) channels.

A temperature controlled multi-channel transmitter optical subassembly (TOSA), consistent with embodiments described herein, may be used in a multi-channel optical transceiver. The temperature controlled multi-channel TOSA generally includes an array of lasers (or laser assemblies) to emit a plurality of different channel wavelengths. The array of lasers can optically couple to an optical multiplexer, such as an arrayed waveguide grating (AWG), to combine multiple optical signals at the different channel wavelengths. In this embodiment, the lasers may be thermally tuned to the channel wavelengths by establishing a global temperature for the array of lasers by applying a uniform/substantially same amount of heat to each laser via a shared temperature control device.

In embodiments disclosed herein, the shared temperature control device is implemented as shared heating device. As generally referred to herein, the term shared heating device refers to a heating device that includes at least one heating element configured to be in thermal communication with two or more lasers of a TOSA such that heat generated by the at least one heating elements gets applied to the two or more lasers in a substantially uniform manner.

Two or more of such shared heating devices may collectively form a composite shared heating device for a TOSA. The amount of current, and by extension, the amount of heat generated by the first and second shared heating devices may be substantially the same to achieve a target global temperature for N number of laser assemblies. Alternatively, a different amount of current may be applied by the first heating device relative to the second heating device. For instance, in scenarios where the first and second heating devices are proximate different ends of each laser assembly, the first and second heating devices may be driven independent of each other to regulate the temperature differently at each end. Laser diodes disposed at the first end proximate the first heating device may therefore be heated substantially by the first heating device, and laser diodes disposed at the second end proximate the second heating device get heated substantially by the second heating device.

In any event, the global temperature may be established based on a controller utilizing a sensor, e.g., mounted to a substrate on which the multi-channel TOSA is mounted, that measures a current temperature of the substrate and/or ambient air. The controller may then compare the current measured temperature received from the sensor against a predefined threshold temperature value. In response to the current measured temperature falling below the predefined threshold temperature, a compensating current value may be determined. For example, the present disclosure has recognized that channel wavelengths shorten in length by about 2 nm for every 10 degrees of temperature decrease. Therefore, the controller can utilize the difference between a current measured temperature and the threshold temperature to determine an overall amount of thermal compensation to apply via communication of a predefined electrical current to a shared heating device. To determine the predefined electrical current, the controller can utilize a lookup table in a memory that associates target temperature values with a value that represents a corresponding compensating current. Alternatively, the controller can utilize a regulation routine in a feedback loop that measures current temperature and then applies a relatively small amount of electrical current to the shared heating device. The amount of electrical current may be increased incrementally until the target global temperature is reached. In some cases, this regulation routine may be executed based on the currently measured temperature being below a threshold value. The amount of electrical current to apply may be based on a simple formula that multiplies each measured 10 degree shift from the threshold temperature by a constant to derive an electrical current. The constant may be predetermined based on, for instance, a calibration routine performed during manufacturing of a TOSA. Accordingly, a 20 degree drop in temperature relative to the predefined threshold temperature can cause the controller to select a proportionally larger current (e.g., 2 times larger) than a measured 10 degree drop in temperature, for instance. In any such cases, range/magnitude of the electrical current to apply to a heating device to compensate for temperature changes may be based on, for example, a calibration routine during manufacturing, heuristics, supervised/unsupervised machine learning routines, and/or through manual entry.

Alternatively, or in addition to the temperature-based regulation approach discussed above, the global temperature may be established, at least in part, by monitoring emitted channel wavelengths such as the shortest channel wavelength, e.g., via a wavelength meter. Based on the monitored wavelengths, temperature of the lasers can be increased via a shared heating device in thermal communication with the lasers until the monitored wavelength substantially reaches the nominal shortest wavelength. This temperature may then be used by the TOSA as the global temperature.

As used herein, "on-board" in the context of a ROSA arrangement includes direct or indirect coupling of ROSA components to a common substrate. The components of the ROSA arrangement may be coupled to the same surface, or different surfaces of the same substrate. Likewise, the TOSA components may be coupled to the same or different surfaces of the substrate. In some cases, the substrate may include multiple pieces/segments, and this disclosure is not intended to be limited to a single substrate.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/ peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Referring to the Figures, FIG. 1 illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 can be pluggable (e.g., comports with pluggable small form factor (SFFP) standards) and transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be within a ±13 nm range and have respective channel wavelengths of 1270 nm, 1290 nm, 1310 nm, and 1330 nm, respectively. Other channel wavelengths and configurations are within the scope of this disclosure including those associated with local area network (LAN) wavelength division multiplexing (WDM). For instance, the optical transceiver module 100 can include up to eight (8) or more channels and provide transmission rates of at least 25 Gbps per channel. The eight channel configuration may include channel wavelengths within a ±2 nm range and have respective channel wavelengths $\lambda 1$-$\lambda 8$ equal to about 1273 nm, 1277 nm, 1282 nm, 1286 nm, 1295 nm, 1300 nm, 1304 nm, and 1309 nm.

The optical transceiver 100 may also be capable of transmission distances of 2 km to at least about 10 km. The optical transceiver 100 may be used, for example, in internet data center applications or fiber to the home (FTTH) applications.

In an embodiment, the optical transceiver module 100 is disposed in a transceiver housing 103. The transceiver housing 103 can be configured with one or more cavities to receive one or more optical transceiver modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals having different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102. The optical transceiver substrate 102 may include traces 116 that couple the TOSA connector pads 114 to the transmit connecting circuit 106. The optical transceiver substrate 102 may include traces 118 that electrically couple the ROSA arrangement 108 to the receiver connecting circuit 112. The optical transceiver substrate 102 may provide an optical transceiver module that may be "plugged" into an optical transceiver cage. Therefore, the transmit connecting circuit 106 and the receiver connecting circuit 112 may electrically couple to external circuitry of the optical transceiver cage. The optical transceiver substrate 102 may be manufactured from a multi-layer printed circuitry board (PCB), although other types of substrates may be utilized and are within the scope of this disclosure. One example embodiment of the optical transceiver substrate implemented as a printed circuit board assembly (PCBA) is discussed in further detail below.

Each of the TOSA modules 104 may be configured to receive driving electrical signals (TX_D1 to TX_D4), convert the electrical signals to a multiplexed optical signal (e.g., a signal with channel wavelengths $\lambda 1 \ldots \lambda n$) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting circuitry. The laser diode devices of the TOSA modules 104 may include distributed feedback lasers (DFBs), Vertical External-cavity Surface-emitting lasers (VECSEL) or other suitable laser devices. In an embodiment, the TOSA modules 104 include a male coupling end to couple into grooves/slots of an associated transceiver module substrate, as discussed below.

The substrate 102 further includes a controller 121 disposed thereon. The controller 121 may comprise, for example, a microcontroller unit (MCU) or processor. The controller 121 may be configured to perform various temperature control methods disclosed herein, with the temperature control methods being performed via software (e.g., C++ code, assembly, and so on), hardware (e.g., circuitry, chips), or a combination thereof. The controller 121 may utilize the temperature wavelength controller 109 implemented in hardware and/or software to perform temperature control methods consistent with the present disclosure. The controller 121 may be electrically coupled to an optional wavelength meter 123 to monitor emitted channel wavelengths as discussed below. Note, the controller 121 and temperature wavelength controller 109 may be implemented within different chips/circuits and the embodiment shown in FIG. 1 is not intended to be limiting.

Continuing on, a shared heating device 111 may be disposed on the TOSA modules 104. The terms shared or common may be used interchangeably herein with reference to the heating device 111. This shared heating device approach departs from other approaches that utilize a thermoelectric cooler (TEC) scheme which can individually raise the temperature of each TOSA module in a relatively fine-grain manner. Thus, the present disclosure provides a relatively coarse-grain temperature control scheme whereby the TOSAs are heated to substantially the same global temperature. While this shared heating device 111 of the embodiment shown in FIG. 1 cannot individually adjust the temperature of each TOSA device by virtue of heating device 111 uniformly communicating the substantially same amount of heat to each TOSA 104, the present disclosure has identified that emitted channel wavelengths can be maintained within ±10 nm of their respective center wavelengths, and preferably within ±2 nm by heating each TOSA 104 to a global temperature via the shared heating device 111. In some cases, this includes only heating each associated LD with the shared heating device 111, although other components may also be heated as well by design or by function of their proximity to the heating device 111. In any event, this shared heating device scheme advantageously reduces the number of components within each TOSA therefore saving space within housings, and also reduces the amount of overall power consumed by the TOSA modules 104 while ensuring the TOSA 104 emit channel wavelengths within nominal tolerances.

Continuing on, the temperature wavelength controller 109 is in electrical communication with the shared heating device 111 to provide an electrical current to cause the same to generate a predetermined amount of heat, as discussed further below. The temperature wavelength controller 109 can monitor channel wavelengths of at least one TOSA module, e.g., via the optional wavelength meter 123, and/or utilize a current temperature value from a sensor to ensure the same is emitting at/within tolerance of the nominal channel wavelength. The current temperature value may be determined via, for instance, a temperature sensor (not shown) in thermal communication with the substrate 102 and/or with the transceiver housing 103.

In any such cases, in response to the monitored channel wavelengths and/or measured temperature, the temperature wavelength controller 109 can increase the temperature of the TOSA modules via the shared heating device 111. In an embodiment, the temperature wavelength controller 109 performs a lookup on a table in memory that associates target temperature values with a corresponding electrical current value.

Alternatively, the electrical current value may be determined based on a formula that takes the difference between a measured temperature and a threshold temperature and multiplies that difference by a predetermined value to determine a resulting electrical current. For example, consider a scenario where the threshold temperature is 0 degrees Celsius, and the measured temperature is −10 degrees. The amount of electrical current may then be calculated by taking the absolute difference (e.g., 10), and multiplying that absolute difference by a predetermined electrical current value, e.g., 10 mA. In this scenario, the amount of electrical current may therefore be equal to about 10 mA per degree of temperature change, and thus, an electrical current of about 100 mA gets applied to the shared heating device 111. The predetermined electrical current value may be determined via a calibration routine during manufacture, although other embodiments are within the scope of this disclosure. The example scenarios and measurement values provided above are for purposes of illustration, and are not intended to limit the present disclosure.

Alternatively, or in addition, the electrical current value may be determined in a feedback loop by incrementally increasing the electrical current applied to the shared heating device 111 until the measured temperature value meets or exceeds a target temperature. Thus, the temperature wavelength controller 109 can utilize the measured temperature to adjust the current amount of electrical current (e.g., up or down) over a period of time T, or whether the present electrical current level should be maintained.

As further in shown FIG. 1, the multi-channel ROSA arrangement 108 includes an optical demultiplexer 124, a photodetector array 126 (e.g., photodiodes), and a transimpedance amplifier (TIA) 128 or amplification circuit 128 for amplifying and converting optical signals into electrical signals. The multi-channel ROSA arrangement 108 may be disposed on the substrate 102 in an on-board configuration, whereby each component is coupled to and supported by the substrate 102. This departs from existing ROSA approaches which utilize a separate and distinct housing, often formed from metal, that includes a cavity for receiving filters/mirrors and other active/passive components for demultiplexing a multi-channel optical signal into constituent channel wavelengths.

Referring to FIGS. 2-6, an example embodiment of an example optical subassembly module 200 is shown consistent with the present disclosure. As shown, the optical subassembly module 200 includes a substrate 202. The substrate 202 may be implemented as the substrate 102 as discussed above with regard to FIG. 1. The substrate 202 includes a first end 203 that extends to a second end 205 along a longitudinal axis 250. The substrate 202 further includes at least a first mounting surface 245 disposed opposite a second mounting surface 246. A ROSA arrangement 208 is disposed on the first mounting surface 245 proximate the first end 203 and includes an on-board or integrated configuration. In the embodiment of FIG. 2, the ROSA arrangement 208 includes a demultiplexer 224, e.g., an arrayed waveguide grating, an optical input port 225, and an optical coupling receptacle 210. One embodiment of the ROSA arrangement 208 is disclosed and described in greater detail in the co-pending U.S. patent application Ser. No. 16/142,466 titled "Receiver Optical Subassembly (ROSA) Integrated on Printed Circuit Board Assembly (PCBA)", which is incorporated herein in its entirety.

Continuing on, a TOSA arrangement 206 is coupled to at least the second mounting surface 246 proximate the first end of the substrate 202 and adjacent the ROSA arrangement 208. As discussed in greater detail below, the TOSA arrangement 206 can include mating surfaces for directly coupling to and being supported by the second mounting surface 246. The TOSA arrangement 206 includes a plurality of laser assemblies, 206-1 to 206-4, configured to launch a plurality of associated channel wavelengths ($\lambda_1$-$\lambda_4$) on to external transmit optical waveguides 207, e.g., optical fibers. As shown, each of the laser assemblies 206-1 to 206-4 include a base that allows for edge mounting via an associated groove of the plurality of grooves 252 provided by the optical coupling end 203 of the substrate 202, which will be discussed in further detail below. The plurality of grooves 252 may also be referred to as a TOSA mounting section. The grooves 252 may be formed by the substrate 202, and thus, the grooves 252 and substrate 202 may be a single piece. However, this disclosure is not limited in this regard and the substrate 202 and grooves 252 may be different pieces.

Figure 4:
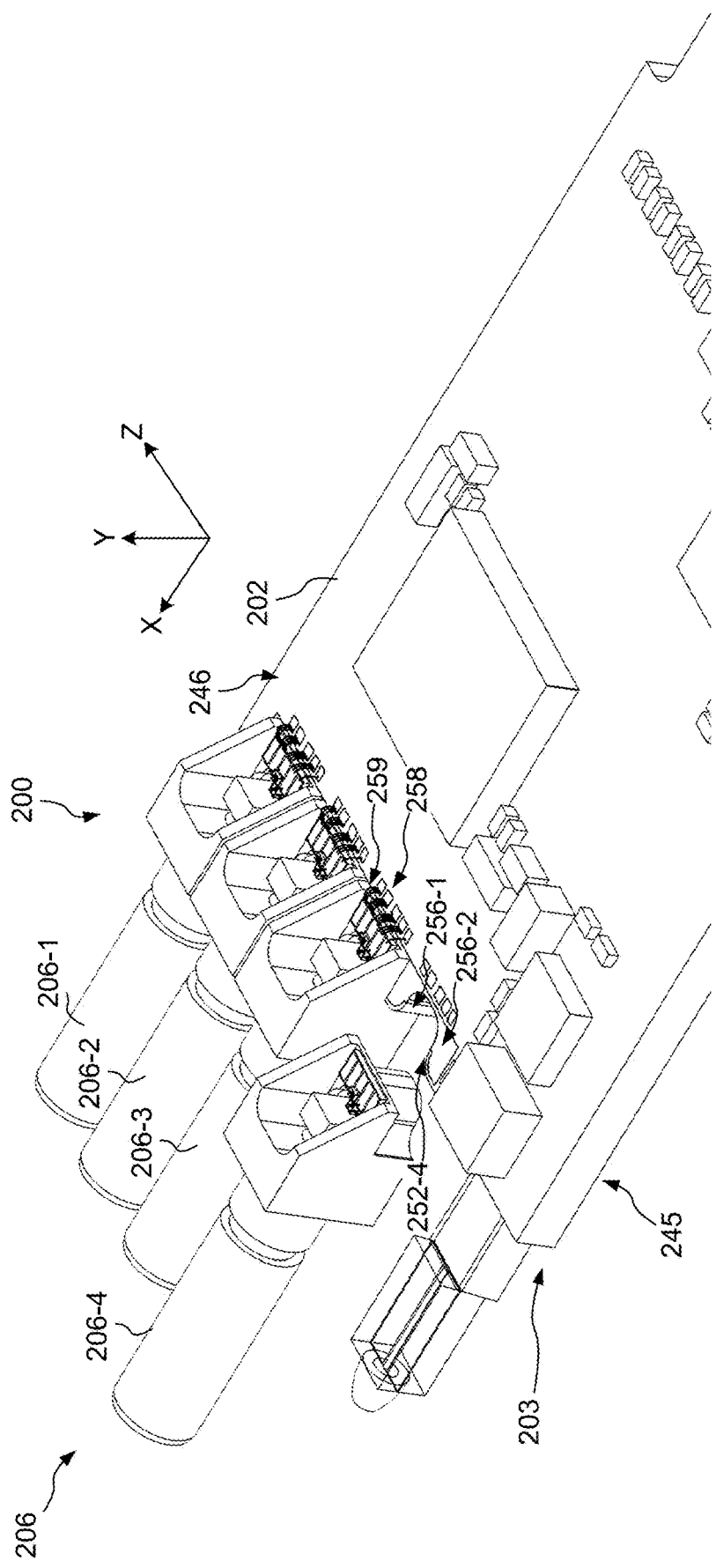
FIG. 4 shows a perspective view of a transceiver module consistent with an embodiment of the present disclosure.
Figure 5:
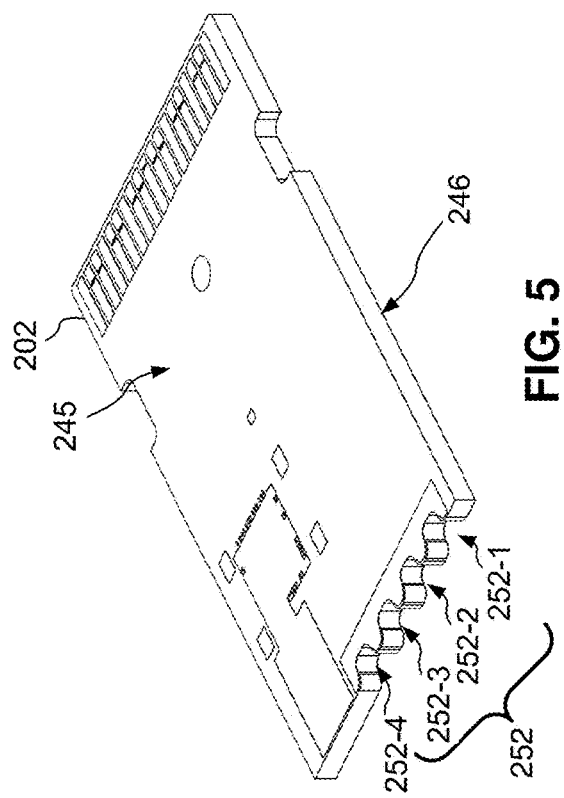
FIG. 5-6 collectively show an example substrate suitable for use in the transceiver module of FIG. 4, in accordance with an embodiment.
Figure 6:
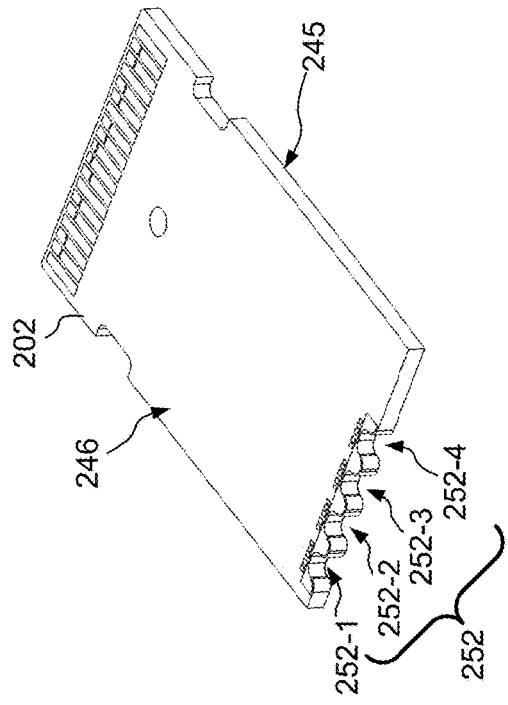

With specific reference to FIGS. 4-6, the substrate 202 may comprise, for example, a printed circuit board assembly (PCBA), such as shown, or other suitable substrate configuration. The optical coupling end 203 of the substrate 202 defines a plurality of grooves 252 which may also be referred to as notches. The grooves shown collectively as 252 and individually as 252-1 to 252-4 may be evenly spaced relative to each other to allow for the laser assemblies 206-1 to 206-4 to be disposed relatively close in proximity to each other. Each of the plurality of grooves 252 provide a female portion for mating and coupling to corresponding male portions of each of the laser assemblies 206-1 to 206-4. This allows the plurality of grooves 252 and laser assemblies 206-1 to 206-4 to form a tongue and groove arrangement for mechanical alignment and integrity. In some cases, the substrate 202 may provide male ends for mating to a female end of each of the laser assemblies 204-1 to 204-4, so the embodiment of FIG. 4 should not be construed as limiting.

In any event, the plurality of grooves 252 may be configured to align each of the laser assemblies along the X, Y and Z axis during assembly of the optical subassembly module 200. Each of the grooves 252 provides at least a first mating surface 256-1 and a second mating surface 256-2 that extend substantially transverse relative to each other. Each of the first and second mating surfaces 256-1 and 256-2 can provide a stop feature that limits travel about the X, Y and Z axis. For example, as shown the laser assembly 204-4 may be aligned and inserted into the associated groove 252-4 such that the male coupling section of the laser assembly 206-4 directly abuts the first mating surface 256-1 defined by the groove 252-4 and directly contacts and is supported by the second mating surface 256-2. Therefore, the first and second mating surfaces 256-1, 256-2 of each of the grooves 252 allow for an associated laser assembly to be easily aligned with, and securely coupled, to the substrate 202. This tongue-and-groove arrangement also aligns each laser assembly with electrical contacts 258 of the substrate 202 for electrical coupling via, for instance, wire bonds 259. Each of the laser assemblies 206-1 to 206-4 may then be attached to the substrate 202 via, for example, welds or other suitable method.

FIGS. 7A-7G collectively show one example of a laser assembly 206-N consistent with an embodiment of the present disclosure. The laser assembly 206-N may also be referred to as a cuboid laser assembly. The laser assembly 206-N includes a base portion 708 or cuboid base portion 708, which may be referred to as simply a base. The base 708 includes an upper portion that includes a notch/cavity 706 defined by sidewalls of the base 708. The cavity 706 provides at least a first mounting surface 709-1 (see FIGS. 7E and 7F). As further shown, a laser diode (LD) sub-mount 710 couples to the first mounting surface 709-1. The LD sub-mount 710 may comprise, for example, a printed circuit board (PCB) with a plurality of traces 714, as shown. A laser diode 712 is mounted on, and electrically couples to, the LD sub-mount 710 by way of wire bonding, for example. The laser diode 712 may comprise an edge emitting diode configured to emit channel wavelengths along an optical path 716 that intersects with one or more passive or active optical components disposed within the base 708 and the optical coupling receptacle 704. For example, as shown in the cross-sectional view of FIG. 7G, the optical path 716 extends through the focus lens 718, aperture 723, optical isolator 722 and fiber stub 724. This configuration may also be referred to as a collinear arrangement whereby the laser diode 712, monitor photodiode 730, lens 718, aperture 723, and optical coupling receptacle are disposed along a common axis. The optical coupling receptacle 704 may be sized to allow for insertion of a ferrule to allow for optical coupling with a transmit optical waveguide, e.g., an optical fiber.

Figure 7A:
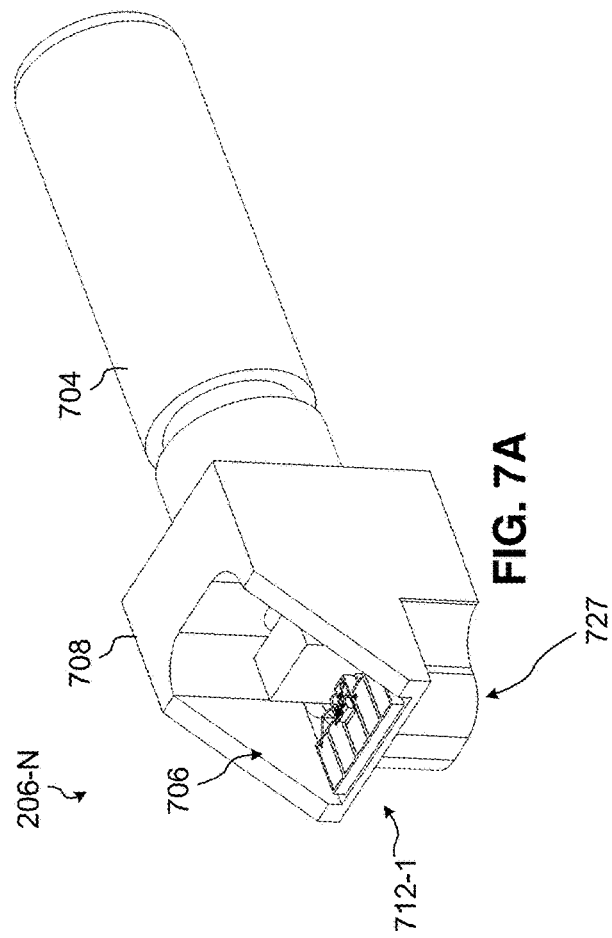
FIGS. 7A-7F collectively show an example TOSA module suitable for use in the transceiver module of FIG. 4, in accordance with an embodiment.
Figure 7B:
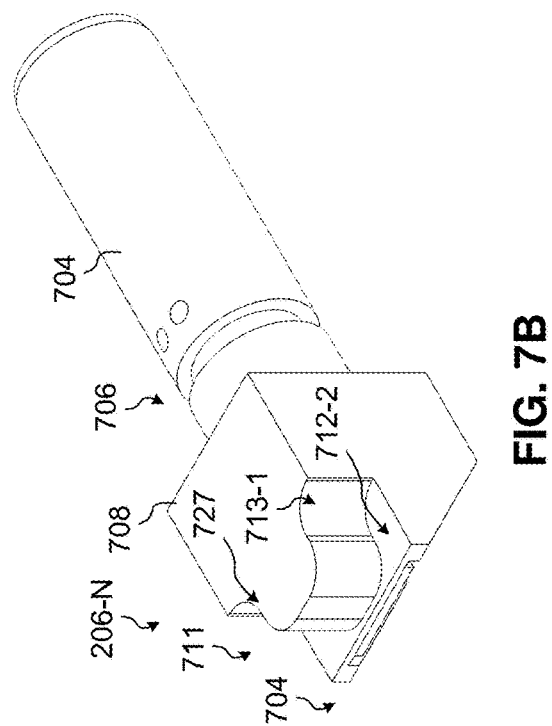
Figure 7C:
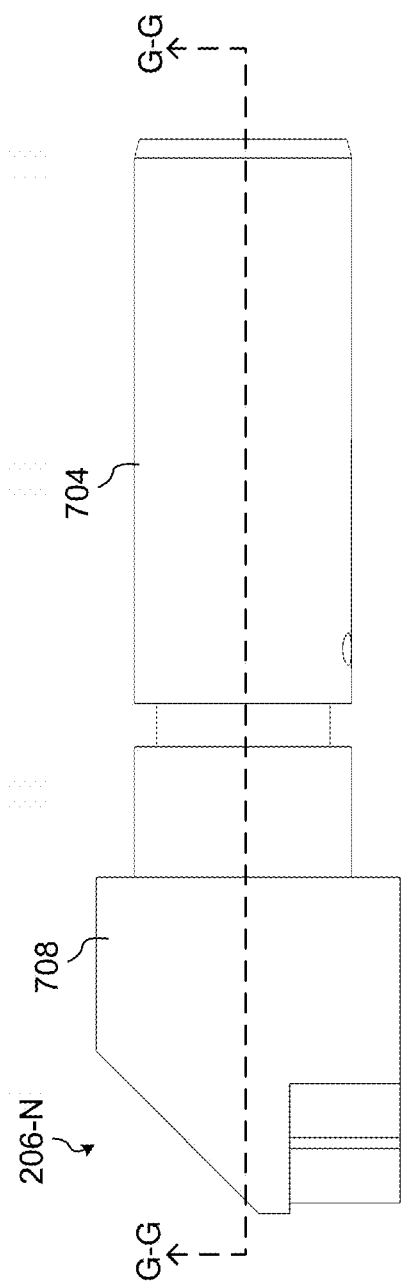
Figure 7D:
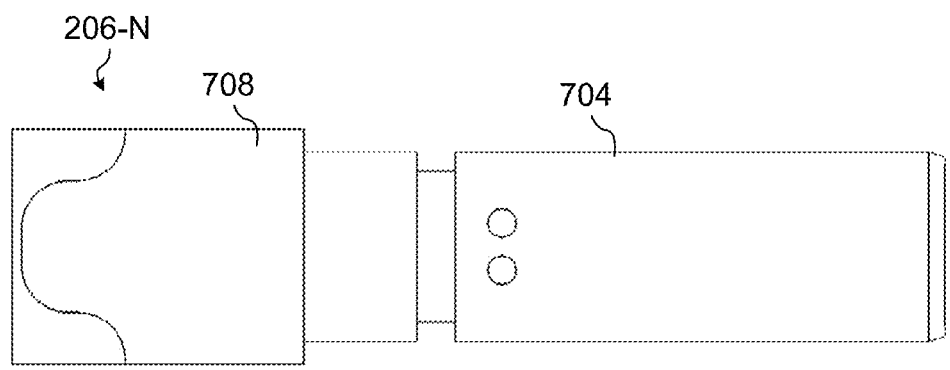
Figure 7E:
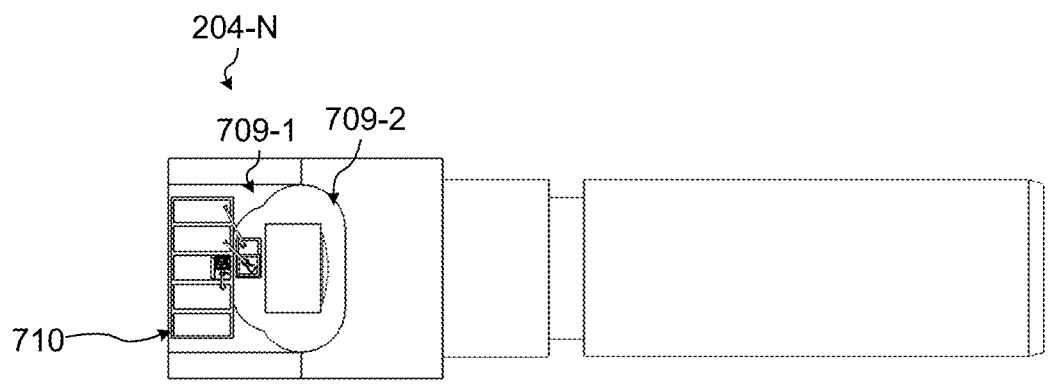

Continuing on, the base 708 of the laser assembly 206-N further includes a lower portion 727 that defines a male coupling section 711 (See FIG. 7B). As shown, the male coupling section 711 includes a generally arcuate profile/shape that corresponds with the female coupling section defined by the plurality of grooves 252 of the substrate 202. In particular, a first mating surface 713-1 defines the generally arcuate shape and is contoured to generally correspond with the first mating surface 256-1 that defines each of the plurality of grooves 252. Therefore, the male coupling section 711 and the female coupling section, e.g., the grooves 252, of the substrate 202 may form a tongue and groove or "keyed" configuration.

The male coupling section 711 further includes a shoulder that is at least partially defined by a second mating surface 712-2. As previously discussed, each of the laser assemblies can include a portion that rests on the substrate 202, and in particular, the second mating surface 256-2. The second mating surface 712-2 of the laser assembly 206-N may be substantially flat and dimensioned to at least partially allow for direct contact with the second mating surface 256-2 of the substrate 202. To this end, the first mounting surface 245 of the substrate 202 may support at least a portion of the base 708 of the laser assembly 206-N based on the second mating surface 256-2.

Figure 7F:
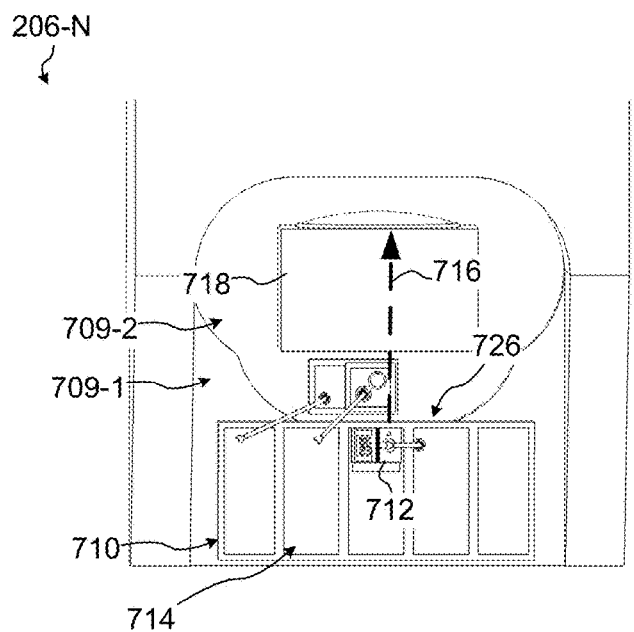
Figure 7G:
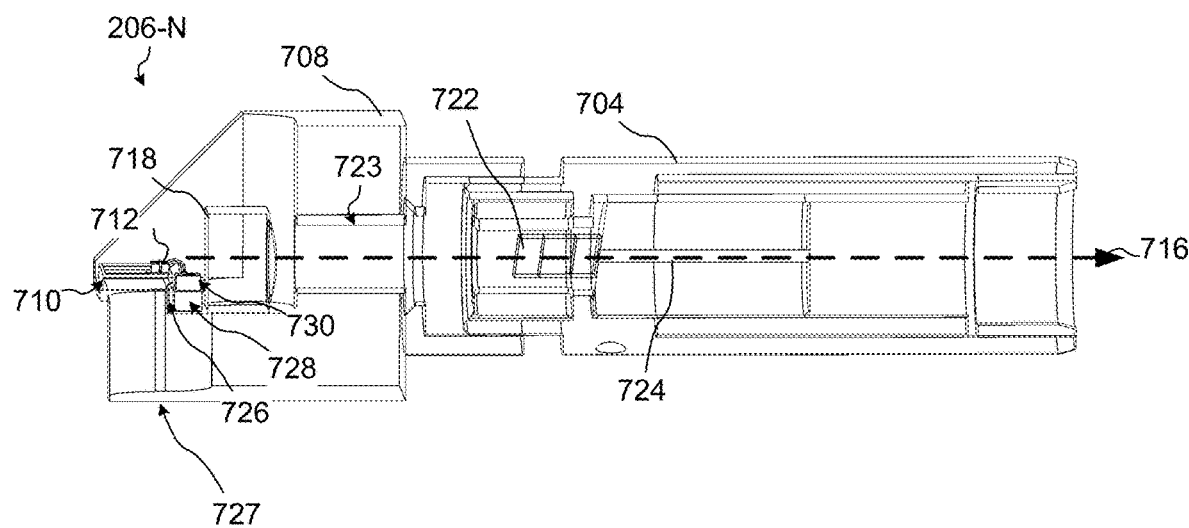
FIG. 7G shows an example cross-sectional view of the TOSA module of FIG. 7C taken along the line G-G.

Continuing on, the laser assembly 206-N further defines a second mounting surface 709-2 within the cavity 706 (See FIG. 7F). The first and second mounting surfaces 709-1, 709-2 may define a step/shoulder based on a surface 726 that extends substantially transverse relative to each of the first and second mounting surfaces 709-1, 709-2 and adjoins the same, which is shown more clearly in FIG. 7G. The surface 726 includes a predefined height that allows a monitor photodiode sub-mount 728 and monitor photodiode 730 to be mounted in a countersunk arrangement whereby the monitor photodiode is disposed between the laser diode 712 and focus lens 718, but does not substantially obstruct channel wavelengths emitted along light path 716. In addition, the countersunk arrangement further allows the light path 716 to intersect with the focus lens 718 substantially at a center of the same.

Note that while the embodiments of FIGS. 5-7G show an arrangement whereby laser assemblies have a male coupling section and the substrate 202 includes a female coupling section, this disclosure is not necessarily limited in this regard. For example, the substrate 202 may include a male coupling section and each laser assembly may include a female coupling section, depending on a desired configuration.

Figure 8A:
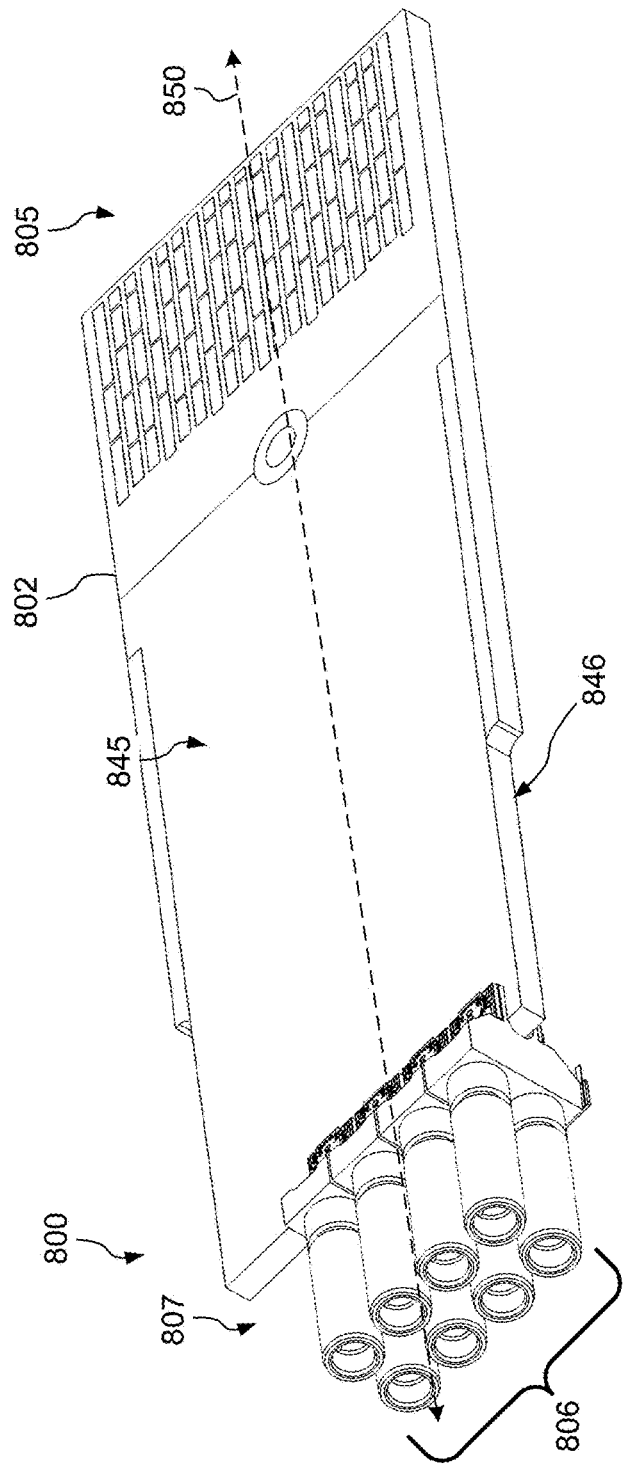
FIGS. 8A-8E collectively show another embodiment of an example transceiver module consistent with the present disclosure.
Figure 8B:
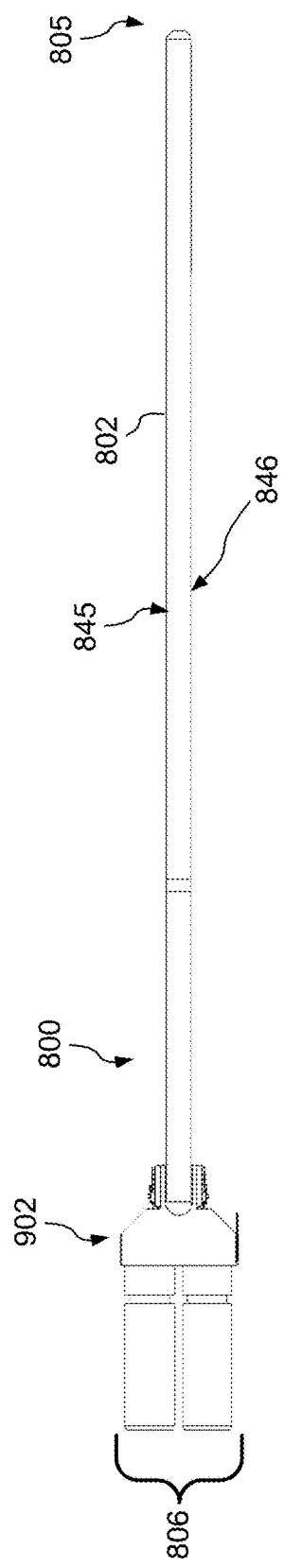
Figure 8C:
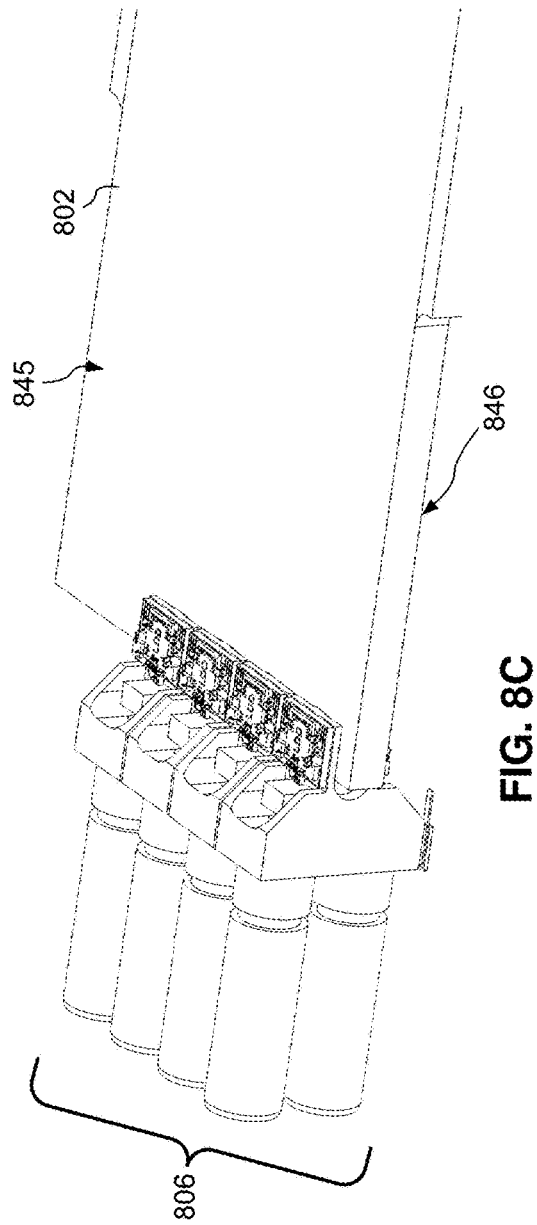

FIGS. 8A-8E collectively show another example of an optical subassembly module 800 in accordance with an embodiment of the present disclosure. As shown, the optical subassembly module 800 includes a substrate 802 that extends from a first end 805 to a second end 807 along a longitudinal axis 850. A plurality of dual laser assemblies 806 are edge mounted to the second end 807. Note that the embodiment shown in FIG. 8A is illustrated without a ROSA arrangement not for purposes of limitation but for reasons of clarity. The optical subassembly module 800 may be configured substantially similar to that of the optical subassembly module 200 discussed above with reference to FIGS. 2-3, and for this reason the description of which will not be repeated for brevity. However, the embodiment of FIG. 8A includes a plurality of dual laser assemblies 806 that provides two 1×4 arrays of dual laser assemblies to provide a total of eight (8) channels. The dual laser assemblies 806 may be in other configurations including 1×N arrays, where N is a number greater than or equal to two. The dual laser assemblies 806 may be spaced uniformly from each other in a side-by-side arrangement to form a linear array, as shown. The dual laser assemblies therefore advantageously increasing channel density for the optical subassembly module 800.

In particular, each of the dual laser assemblies 806 include a mounting portion configured to couple into grooves 852 (FIG. 8E) of the substrate 802, which is discussed below in further detail. As further shown, the plurality of dual laser assemblies 806 mount to the first and second mounting surfaces 845, 846 to securely hold the plurality of dual laser assemblies in place. During manufacturing of the optical subassembly module 800, the plurality of laser assemblies 806 may be individually coupled to respective grooves of the plurality of grooves 852 with alignment provided by their respective base portion that provides an interlocking arrangement. The grooves 852 may be disposed at predefined locations and spacing relative to each other to allow for relatively easy alignment along the X, Y and Z axis of associated dual laser assemblies. Notably, the structure of the dual laser assemblies 806 ensures proper alignment about each of the X, Y and Z axis by limiting travel. Accordingly, attachment during manufacture may be performed by simply coupling the dual laser assemblies 806 into grooves 852.

Figure 8D:
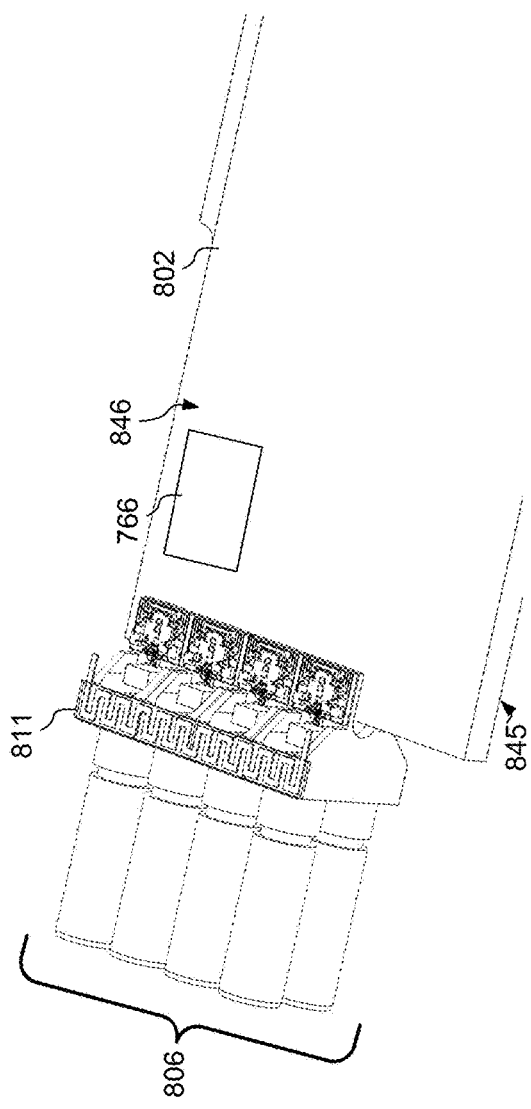
Figure 8E:
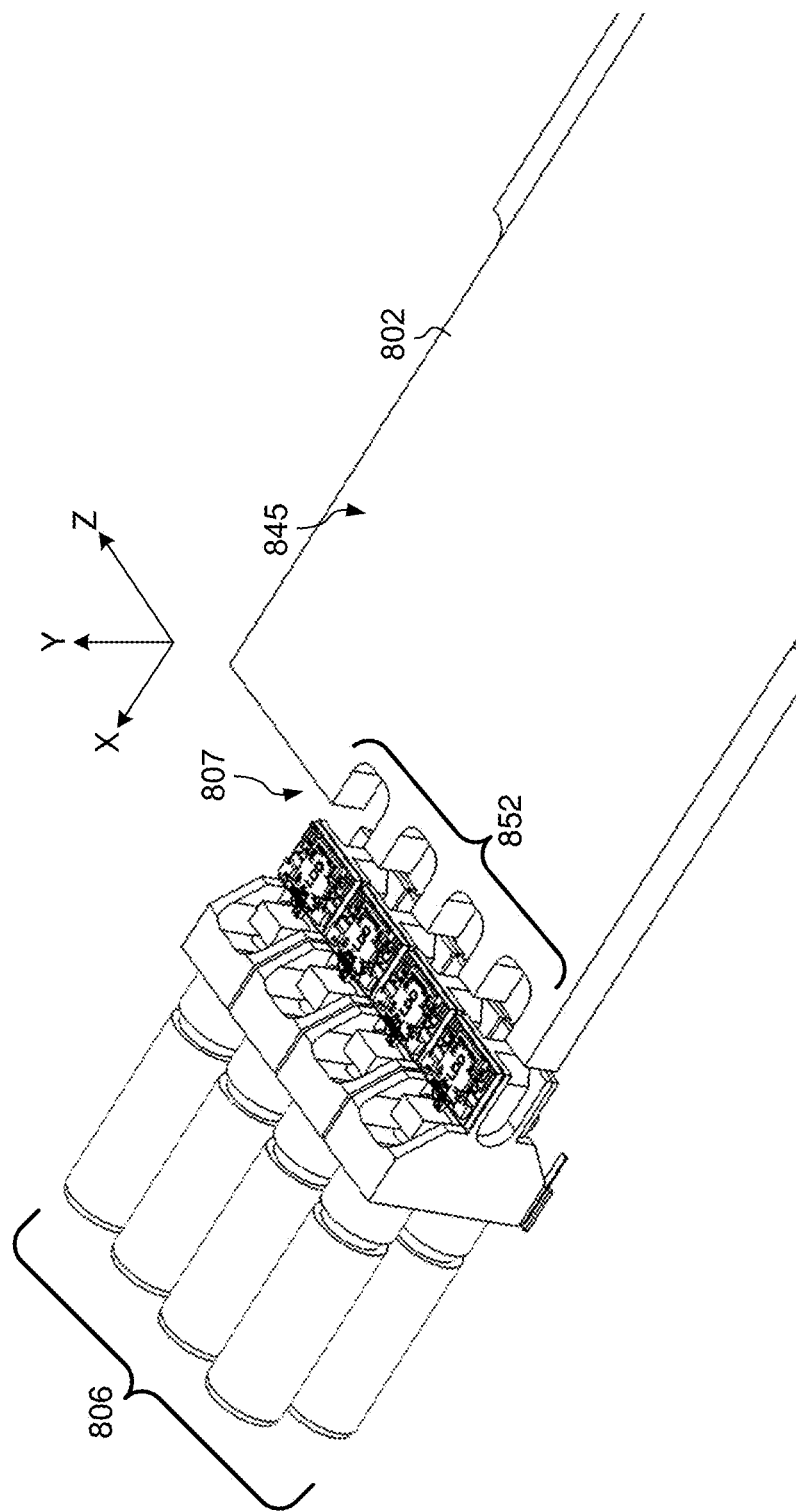

A heating device (also referred to herein as a heating element) 811 (FIG. 8D) may be disposed on the plurality of dual laser assemblies 806. The heating element 811 may extend substantially transverse relative to the longitudinal axis 850 of the substrate 802. The heating element 811 may be utilized to stabilize emitted channel wavelengths by adjusting temperature. The heating element 811 may comprise a resistive heating device such as a coil (as shown) or other suitable device. Although the embodiment of FIG. 8D shows a single heating device, and more particularly a single heating element, this disclosure is not limited in this regard. A TOSA consistent with the present disclosure can include N number of heating devices. For instance, two heating devices comprising two heating coils can collectively comprise a composite shared heating device and may be disposed on opposite sides of the dual laser assemblies 806. This may allow each respective row of laser diodes to be independently heated via an associated heating device, or heated as a single unit by the same current being applied to both heating devices.

Note that the heating element 811 and features of the same as discussed herein may be equally utilized by the laser assemblies of FIGS. 2-7G with minor modification. In addition, the heating element 811 may be disposed at other locations on a laser assembly and not necessarily on a top or bottom surface as is shown FIG. 8D.

The temperature controlled multi-channel TOSA further includes a temperature wavelength control system (or chip) 766 for controlling the heating element 811 (See FIG. 8D). The temperature wavelength control system 766 may be implemented as the temperature wavelength controller 109 discussed above with reference to FIG. 1. The temperature wavelength control system 766 may be implemented, for example, using any combination of hardware, software and firmware and may be located on a circuit board, such as shown in FIG. 8D.

In this embodiment, the plurality of dual laser assemblies 806 may be accurately referred to as a temperature controlled multi-channel TOSA. A temperature control system, as will be described in greater detail below, controls the temperature of the lasers collectively/uniformly to provide at least one wavelength with a desired wavelength precision or accuracy. In one example, the temperature of each laser is maintained within ±1° C. in the operating range between −5 and 70° C. to maintain a wavelength precision or accuracy of about ±2 nm. The temperature control system can regulate TOSA temperature by raising temperature in a uniform manner across the lasers to a target global temperature. The global temperature can be selected in response to monitored wavelengths associated with the laser that emits a shortest channel wavelength. Alternatively, or in addition, the global temperature may be selected based on a measured temperature being below a predefined threshold temperature, as discussed above.

During operation, for example, the heating element 811 may be used to establish a consistent global temperature for the dual laser assemblies 806. The heating element 811 may be used to raise the local temperature of each of the lasers 806 collectively at or above the global temperature, e.g., to adjust the shortest channel wavelength. The body/base 908 (FIG. 9A) of each dual laser assembly facilitates thermal communication with the laser arrangements disposed thereon, and in particular, the laser diodes of each laser arrangement.

In one embodiment, the global temperature T1 may be selected via a tuning phase whereby emitted channel wavelengths are monitored, e.g., by the temperature wavelength controller 109 via wavelength meter 123, and temperature is increased across the dual laser assemblies 806 until the monitored channel wavelengths are within nominal tolerances, e.g., within ±10 nm and preferably within in ±2 nm. In this embodiment, the shortest emitted channel wavelengths may be monitored. Alternatively, the shortest channel wavelength of the top row of laser diodes and the shortest channel wavelength of the bottom row of the laser diodes may be monitored. During this tuning stage, the temperature increase may manifest as incremental increases by, for instance, 1-5 degrees Celsius through the application of a predetermined amount of electrical current across the shared heating device 811 such as 10-100 mA. In response to the monitored channel wavelengths being within tolerance, the global temperature T1 is then set equal to the current temperature as reported by a temperature sensor or via interpolation based on the amount of current being applied to the shared heating device 811. Thus, at the end of the tuning phase the laser(s) having the shortest channel wavelength is then tuned to its nominal channel wavelength, and by extension, the other lasers are also heated to the global temperature T1 and coarsely tuned as a result, e.g., within about 10 nm of their nominal channel wavelength, and preferably within about 2 nm of their nominal channel wavelength.

In an embodiment, the tuning phase can also include measuring the current temperature of the array of dual laser assemblies via a temperature sensor and supplying electrical current to the shared heating device 111. The temperature of the lasers may then be raised incrementally by supplying an increasing amount of current over a predetermined period of time until the currently measured temperature reaches the global temperature T1. The global temperature T1 may be selected based on a lookup table or via a formula as discussed above, for example. In this embodiment, using the temperature sensor advantageously eliminates the necessity of monitoring emitting channel wavelengths during tuning, and thus by extension, the necessity of having a wavelength meter and other supporting circuitry.

Once tuned, the temperature wavelength control system 766 maintains the global temperature for the dual laser assemblies. In particular, the temperature wavelength control system 766 may continue to apply a particular amount of electrical current to maintain the lasers at the global temperature. The temperature wavelength control system 766 may then receive periodic temperature measurements (e.g., a temperature signal) from a temperature sensor (not shown), and perform re-tuning as described above in the event the difference between the measured temperature and global temperature exceeds a predetermined threshold, e.g., 1-5 degrees Celsius. In such cases, a tuning stage, e.g., as discussed above, may be used to cause the temperature of the lasers to be substantially equal to the global temperature T1. The process of tuning as discussed above to determine the global temperature can also occur periodically, or any other interval (e.g., once at startup).

Accordingly, the temperature controlled multi-channel TOSA, consistent with embodiments described herein, allows the dual laser assemblies 806 to be collectively thermally tuned to a global temperature that ensures at least the shortest nominal channel wavelength is emitted. The emitted channel wavelengths of the other lasers remain within, for instance about ±10 nm, and preferably ±2 nm of the nominal channel wavelengths. The temperature control and wavelength tuning may thus be implemented with less complex circuitry and in a smaller space with lower power consumption relative to other approaches that heat and cool each laser individually.

Figure 9A:
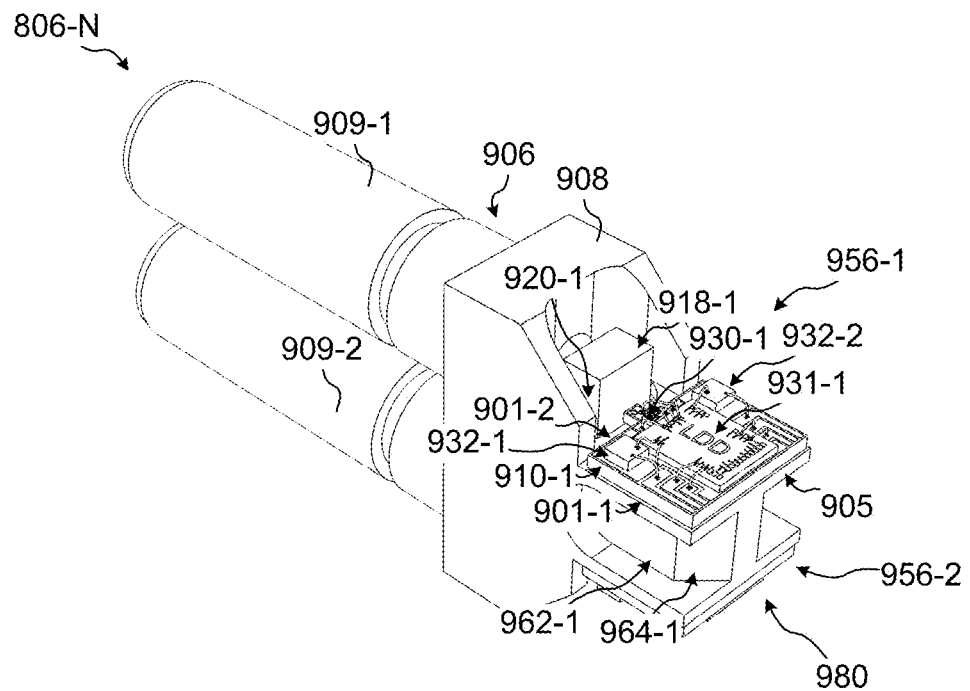
FIGS. 9A-9D collectively show an example dual laser assembly suitable for use in the optical transceiver module of FIG. 8A, in accordance with an embodiment.

FIG. 9A shows an example dual laser assembly 806-N in isolation for ease of description and clarity. As shown, the dual laser assembly 806-N includes a base 908 having a first end 905 that extends to a second end 906. The first end 905 may be electrically coupled to an associated transmit connecting circuit (not shown), and therefore may also be referred to as an electrical coupling end. On the other hand, the second end 906 is proximate optical fiber coupling receptacles 909-1, 909-2, and therefore may be referred to as an optical coupling end.

The base 908 includes at least first and second mounting sections 901-1, 901-2 disposed opposite each other to mount to first and second laser arrangements 956-1, 956-2, respectively. In an embodiment, the first and second mounting sections 901-1, 902-2 and associated laser arrangements may be substantially symmetrical to provide a dual laser arrangement. For instance, the embodiment of FIG. 9D illustrates how the base 908 provides a substantially symmetric profile/shape about the top and bottom portions of the base 908, with the first and second laser arrangements 956-1, 956-2 being substantially mirror images of each other.

Figure 9B:
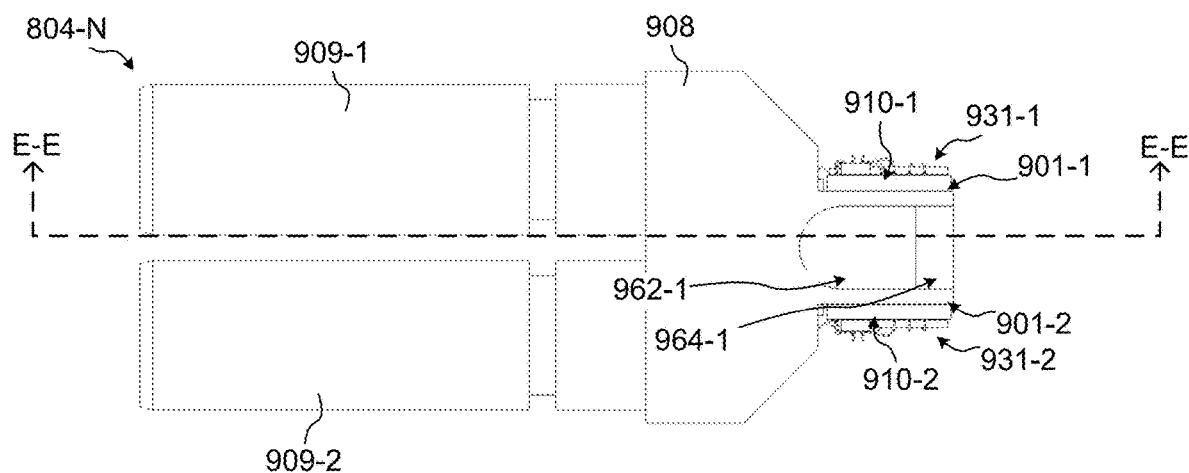
Figure 9C:
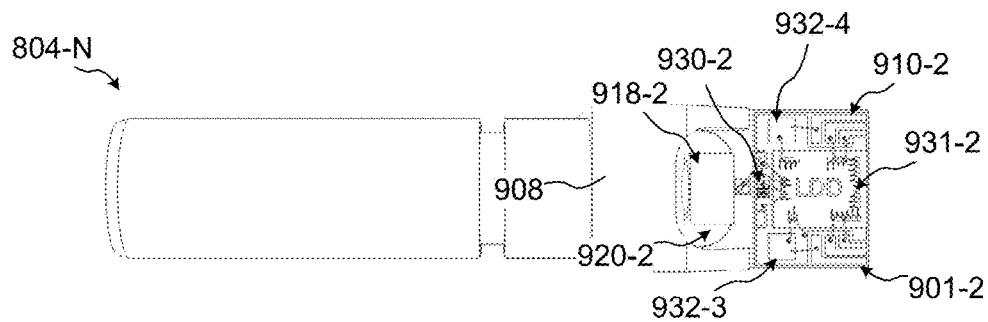
Figure 9D:
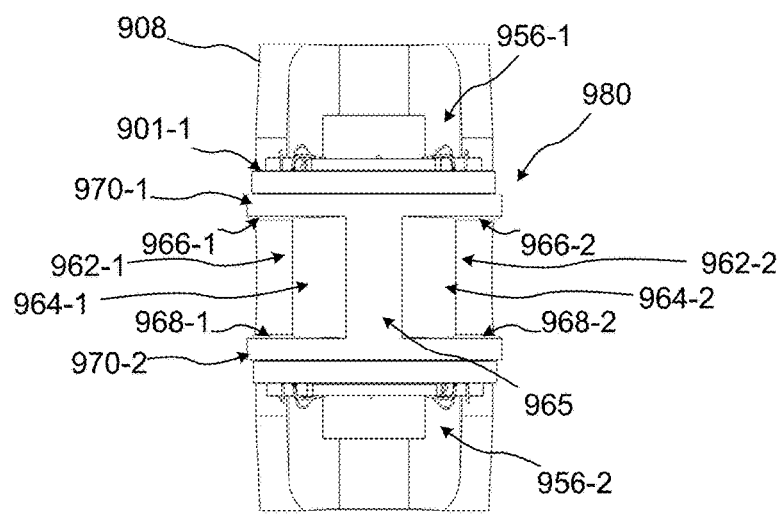

With specific reference to FIGS. 9A-9C, the first laser mounting section 901-1 includes a first mounting surface 910-1 for mounting to active and/or passive optical components that extends parallel with a longitudinal axis of the optical fiber coupling receptacles 909-1, 909-2. As shown, the mounting section 901-1 further includes a laser diode driver (LDD) submount 910-1. The LDD submount 910-1 includes a LDD chip 931-1 mounted and electrically coupled thereto. Likewise, the LDD submount 910-1 includes first and second filtering capacitors 932-1, 932-1 mounted and electrically coupled thereto. The mounting section 901-1 further includes a first laser diode 930-1 mounted to the first mounting surface 901-1 and disposed between the LDD submount 910-1 and the focus lens 918-1. Following the LDD submount 910-1 is a recessed mounting region 920-1. As discussed further below, the recessed mounting section 920-1 provides a countersunk arrangement which allows for the first focus lens 918-1 to have a center substantially aligned with an emission surface/face of the laser diode 930-1.

The second laser mounting section 901-2 includes a first surface 910-2 for mounting to active and/or passive optical components that extends parallel with a longitudinal axis of the optical fiber coupling receptacles 909-1, 909-2. As shown, the second mounting section 901-2 includes a laser diode driver (LDD) submount 910-2. The LDD submount 910-2 includes a LDD chip 931-2 mounted and electrically coupled thereto. Likewise, the LDD submount 910-2 includes first and second filtering capacitors 932-3, 932-4 mounted and electrically coupled thereto. The second laser mounting section 901-2 further includes a laser diode 930-2 mounted to the second mounting surface 901-2 and disposed between the LDD submount 910-2 and the focus lens 918-2. Following the LDD submount 910-2 is a recessed mounting region 920-2. The recessed mounting section 920-2 provides a countersunk arrangement which allows for the second focus lens 918-2 to have a center substantially aligned with an emission surface/face of the laser diode 930-2.

As discussed above, the each dual laser assembly can easily couple into corresponding grooves of the plurality of grooves 852 to mount to the substrate 802. One example mounting section 980 is shown in greater detail in FIGS. 9A, 9B and 9D. With specific reference to FIG. 9D, the mounting section 980 is defined by the base 908 and includes first and second sidewalls 962-1, 962-2, disposed opposite each other. Each of the first and second sidewalls 962-1, 962-2 support the first and second mounting surfaces 901-1, 901-2 and are defined by surfaces that extend substantially transverse relative to the same. The first and second sidewalls 962-1, 962-2 transition to first and second tapered sidewalls 964-1, 964-2, respectively. A mating surface 965 adjoins the first and second tapered sidewalls 964-1, 964-2.

The base 908 may therefore provide a so-called "I" or "EYE" beam shape that includes top and bottom flanges 970-1, 970-2 which are connected by a middle section or web at 965. The taper of the middle section allows the base 908 to self-align into an associated groove of the plurality of grooves 852. The mating surface 965 may therefore directly abut or otherwise be in close proximity to the substrate 902 when the base 908 is inserted into an associated groove. The first and second tapered sidewalls 962-1, 962-2 and/or the first and second sidewalls 964-1, 964-2 may also directly abut the substrate 902 or otherwise be in close proximity, and may therefore may also provide additional mating surfaces to securely hold the dual laser assembly 806-N in an associated groove of the plurality of grooves 852.

Figure 9E:
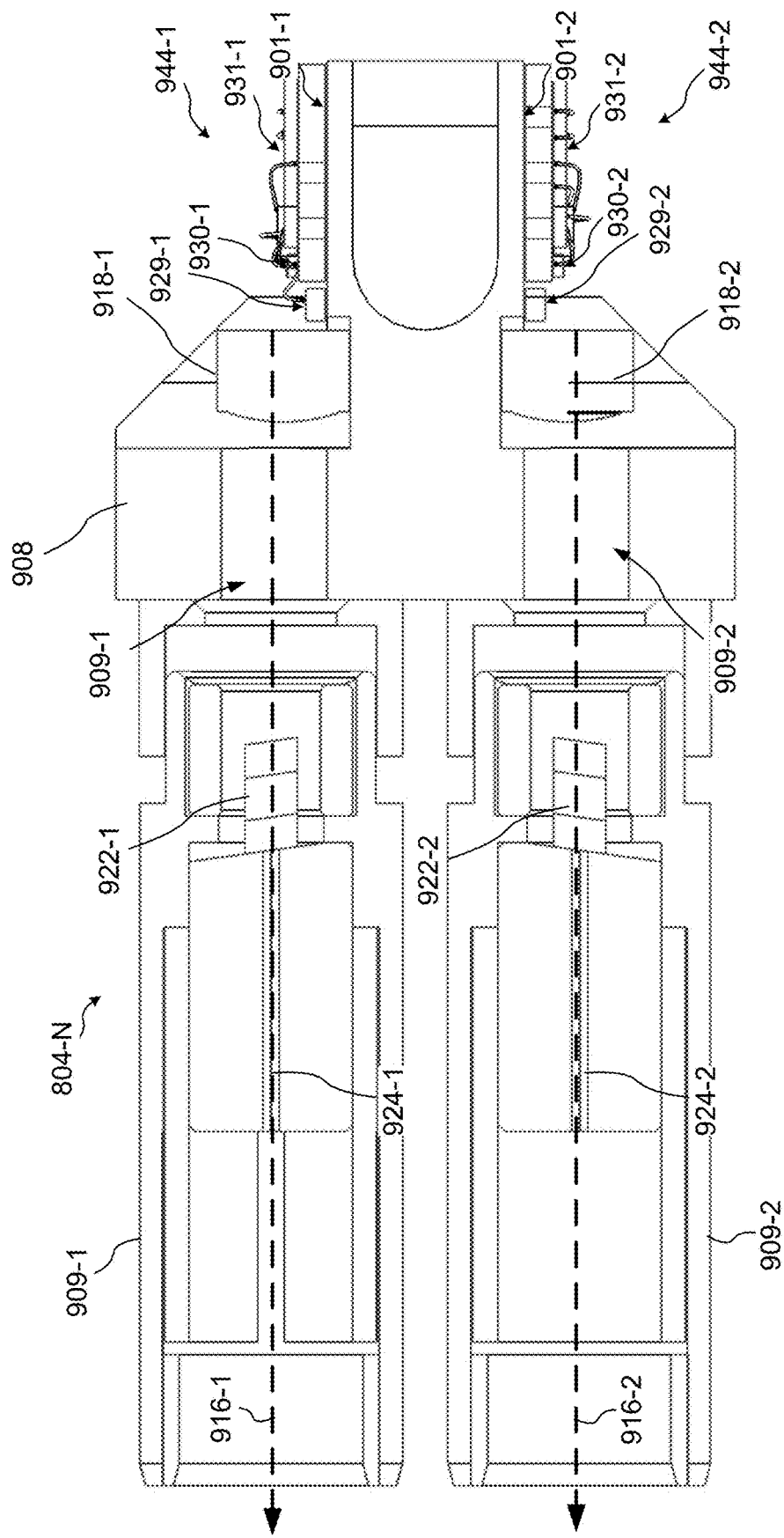
FIG. 9E shows a cross-sectional view of the TOSA module of FIG. 9B taken along line E-E, in accordance with an embodiment.

Turning to FIG. 9E, a cross-sectional view of the dual laser assembly 806-N taken along the line E-E (See FIG. 9B) is shown in accordance with an embodiment. As shown, the first laser mounting section 901-1 includes a first laser arrangement 944-1. The first laser arrangement 944-1 includes a first LDD chip 931-1, first laser diode 930-1, and a first monitor photodiode 929-1. The second laser mounting section 901-2 includes a second laser arrangement 944-2. The second laser arrange 944-2 includes a second LDD chip 931-2, second laser diode 930-2, and a second monitor photodiode 929-2. The first and second laser arrangements 944-1, 944-2 are configured to launch an associated channel wavelength on to first and second optical paths 916-1, 916-2, respectively. The first and second optical paths 916-1, 916-2 may extend substantially parallel to each other and extend through a plurality of active and/or passive optical components before being launched onto, for example, an external transmit fiber. For example, the first optical path 916-1 extends through the first aperture 909-1, a first optical isolator 922-1, and a first fiber stub 924-1. Likewise, the second optical path 916-2 extends through a second aperture 909-2, a second optical isolator 922-2 and a second fiber stub 924-2. The embodiment shown in FIG. 9E may be referred to as a collinear arrangement whereby each of the LDD chip, laser diode, monitor photodiode are disposed along the same axis.

One aspect of the present disclosure includes a laser assembly. The laser assembly comprising a base defined by a plurality of sidewalls, the base comprising at least a first surface for mounting a laser arrangement, an aperture for optically aligning the laser arrangement with an optical coupling receptacle, and a male coupling section defined by at least one sidewall of the plurality of sidewalls, the male coupling section defined by at least a first mating surface that extends substantially transverse relative to the first mounting surface, the male coupling section being shaped to generally correspond with a mating groove of a printed circuit board of an optical transceiver module.

Another aspect of the present disclosure includes an optical transceiver. The optical transceiver comprising a housing defining a cavity for receiving an optical transceiver module, and an optical transceiver module disposed at least partially within the cavity of the housing, the optical transceiver module comprising, a substrate having a first end that extends to a second end, the substrate having at least a first mounting surface, a plurality of mating grooves at the first end of the substrate for coupling to laser assemblies, and a plurality of laser assemblies, each of the plurality of laser assemblies comprising a base that provides at least a first surface for mounting a laser arrangement and a male coupling section, the male coupling section defined by at least a first mating surface that extends substantially transverse relative to the first mounting surface and is shaped to generally correspond with a mating groove of the plurality of mating grooves.

In accordance with an aspect of the present disclosure, an optical subassembly module is disclosed. The optical subassembly module comprising a substrate providing at least one mounting surface for coupling to at least one optical component, the substrate being defined by a first end that extends to a second end, an array of laser assemblies coupled proximate the first end of the substrate, the array of laser assemblies being configured to emit a plurality of channel wavelengths, and a resistive heating device thermally coupled to each laser assembly of the array of laser assemblies to establish a global temperature for the array of laser assemblies.

In accordance with another aspect of the present disclosure a multi-channel optical transceiver is disclosed. The multi-channel optical transceiver comprising a pluggable transceiver module comprising, a substrate providing at least one mounting surface for coupling to at least one optical component, the substrate being defined by a first end for optically coupling to optical waveguides and a second end for electrically coupling to a transmit connecting circuit, an array of laser assemblies coupled proximate the first end of the substrate, the array of laser assemblies being configured to emit a plurality of channel wavelengths, a resistive heating device disposed across the array of laser assemblies, the resistive heating device thermally coupled to each laser assembly of the array of laser assemblies to establish a global temperature, and a multi-channel optical receiver subassembly (ROSA) disposed on the substrate.

In accordance with another aspect of the present disclosure a computer-implemented method for temperature regulation of a multi-channel transmitter optical subassembly (TOSA) having a plurality of laser assemblies and a shared heating device disposed on and in thermal communication with each laser assembly of the plurality of laser assemblies is disclosed. The computer-implemented method comprising receiving, by a controller, a measurement signal corresponding to a temperature of the TOSA, determine, by the controller, a global temperature and a corresponding electrical current associated with the global temperature based on the measurement signal, and supply, by the controller, the electrical current to the resistive heating device to cause the resistance heating device to generate heat and raise the temperature of each laser assembly of the TOSA to substantially the global temperature.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical subassembly module comprising:
   a substrate providing at least one mounting surface for coupling to at least one optical component, the substrate being defined by a first end that extends to a second end;
   an array of laser assemblies coupled proximate the first end of the substrate, the array of laser assemblies being configured to emit a plurality of channel wavelengths; and
   a resistive heating device thermally coupled to each laser assembly of the array of laser assemblies to establish a global temperature for the array of laser assemblies,
   wherein each laser assembly of the array of laser assemblies includes a base that defines a mating surface to couple to the substrate, each base having first and second mounting surfaces disposed opposite each other such that the first and second mounting surfaces face in opposite directions, and wherein the first and second mounting surfaces include first and second laser arrangements, respectively, disposed thereon, the first and second laser arrangements being configured to emit different channel wavelengths relative to each other.

2. The optical subassembly module of claim 1, further comprising a temperature wavelength controller electrically coupled to the resistive heating device, the temperature wavelength controller to determine an electrical current to apply to the resistive heating device to cause the resistive heating device to establish the global temperature for the array of laser assemblies.

3. The optical subassembly module of claim 2, wherein the temperature wavelength controller determines the electrical current based on a temperature signal from a temperature sensor associated with the optical subassembly module.

4. The optical subassembly module of claim 2, wherein the temperature wavelength controller determines the electrical current based on an output of a wavelength meter that monitors at least one channel wavelength emitted by the optical subassembly module.

5. The optical subassembly module of claim 4, wherein the at least one channel wavelength is the shortest channel wavelength of the emitted plurality of channel wavelengths.

6. The optical subassembly module of claim 1, wherein the resistive heating device comprises a coil that extends across the array of laser assemblies.

7. The optical subassembly module of claim 1, wherein the array of laser assemblies include two 1×4 arrays of lasers configured to output eight different channel wavelengths.

8. The optical subassembly module of claim 1, wherein the substrate further comprises a receiver optical subassembly (ROSA) arrangement coupled to the first end of the substrate proximate to the array of laser assemblies.

9. The optical subassembly module of claim 1, wherein each laser arrangement of the first and second laser arrangements includes a laser diode driver (LDD), monitor photodiode (PD), and a laser diode (LD).

10. The optical subassembly module of claim 1, wherein the base includes a mounting section defined at least in part by first and second tapered sidewalls.

11. The optical subassembly module of claim 10, wherein the mounting section is configured to couple to a corresponding notch provided by the first end of the substrate, and wherein the mounting section and notch form a tongue and groove arrangement to provide mechanical alignment of the base with the substrate.

12. The optical subassembly module of claim 1, wherein the optical subassembly module is configured to transmit local area network (LAN) wavelength division multiplexed (WDM) channel wavelengths.

13. The optical subassembly module of claim 1, wherein the mating surface of each base is disposed between the first and second laser assemblies.

14. The optical subassembly of claim 1, wherein each base of the plurality of laser arrangements is configured to edge mount to the substrate.

\* \* \* \* \*